United States Patent [19]

Kinsman

[11] Patent Number: 5,789,803
[45] Date of Patent: Aug. 4, 1998

[54] SEMICONDUCTOR PACKAGE

[75] Inventor: Larry D. Kinsman, Boise, Id.

[73] Assignee: Micron Technology, Inc., Boise, Id.

[21] Appl. No.: 843,394

[22] Filed: Apr. 15, 1997

Related U.S. Application Data

[62] Division of Ser. No. 515,812, Aug. 16, 1995, Pat. No. 5,696,033.
[51] Int. Cl.$^6$ ............................................. H01L 23/495
[52] U.S. Cl. .......................... 257/666; 257/676; 257/787
[58] Field of Search ............................. 257/666, 676, 257/787, 689

[56] References Cited

U.S. PATENT DOCUMENTS

| | | | |
|---|---|---|---|
| 4,837,184 | 6/1989 | Lin et al. | 457/217 |
| 4,862,245 | 8/1989 | Pashby et al. | 357/70 |
| 4,916,519 | 4/1990 | Ward | 357/70 |
| 4,994,411 | 2/1991 | Naito et al. | 437/209 |
| 5,106,784 | 4/1992 | Bednarz | 437/214 |
| 5,114,880 | 5/1992 | Lin | 437/217 |
| 5,252,853 | 10/1993 | Michii | 257/666 |
| 5,286,679 | 2/1994 | Farnworth | 437/209 |
| 5,290,735 | 3/1994 | Haley | 437/217 |
| 5,358,904 | 10/1994 | Murakami et al. | 437/217 |
| 5,369,059 | 11/1994 | Eberlein | 437/213 |
| 5,432,127 | 7/1995 | Lamson et al. | 437/182 |
| 5,572,066 | 11/1996 | Safai et al. | 257/666 |

*Primary Examiner*—Tom Thomas
*Assistant Examiner*—Roy Potter
*Attorney, Agent, or Firm*—Stephen A. Gratton

[57] ABSTRACT

A method for packaging a semiconductor die includes the steps of: attaching the die to a lead-on-chip (LOC) leadframe; electrically connecting bond pads on the die to lead fingers on the leadframe; forming a glob top on the bond pads and a portion of the lead fingers; and then trimming and forming the lead fingers into leads. The glob top protects the bond pads and leads and secures the leads to the die. In addition, the glob top leaves most of a face of the die exposed. The completed package has a small footprint which matches the peripheral shape of the die. During the packaging process a support structure such as a molded carrier ring can be formed on the leadframe to facilitate handling and testing of the singulated die.

22 Claims, 3 Drawing Sheets

SEMICONDUCTOR PACKAGE

CROSS REFERENCE TO RELATED APPLICATIONS

This application is a division of application Ser. No. 08/515,812 filed Aug. 16, 1995, U.S. Pat. No. 5,696,033.

FIELD OF THE INVENTION

This invention relates to semiconductor manufacture and more particularly to an improved method for packaging a semiconductor die and an improved small outline semiconductor package.

BACKGROUND OF THE INVENTION

In semiconductor manufacture, a single semiconductor die (or chip) can be packaged within a sealed package. The package protects the die from damage and from contaminants in the surrounding environment. In addition, the package provides a substantial lead system for electrically connecting the integrated circuits on the die to the outside world.

A packaging process for packaging semiconductor dice typically begins with a leadframe. The leadframe is a metal frame which supports several dice for packaging and provides the leads for the packaged product. During a conventional packaging process each die is attached to a mounting paddle of the leadframe utilizing an adhesive. The adhesive is typically formed of an epoxy, acrylic, silicone, or polyimide material that is sandwiched between the bottom of the die and the mounting paddle.

Also during the packaging process, the bond pads of the die are electrically connected to the leadframe using a wire bonding process. A polyimide protective layer is then applied to the face of the die, and the die and mounting paddle are encapsulated in a plastic material. After encapsulation, a trim and form operation separates the packages and shapes the leads into a desired configuration.

A recently developed packaging process is known as lead-on-chip (LOC) packaging. Lead-on-chip packaging is described in U.S. Pat. Nos. 4,862,245 to Pashby et al. and 4,916,519 to Ward incorporated herein by reference. A leadframe for a lead-on-chip die is formed without a mounting paddle. The lead fingers of the leadframe not only electrically attach to the bond pads via the bond wires but also attach to the face of the die and support the die during the encapsulation process. This configuration provides superior heat transfer from the die and shortens the length of the bond wires. In addition, the reliability of the package seal is also enhanced.

One problem with lead-on-chip packaging and with packaged dice in general, is that the package adds to the size and volume of the die. In particular, the encapsulation material is considerably larger and heavier than the unpackaged die. In addition, the packaging process is expensive and requires specialized equipment to manufacture.

Recently, semiconductor manufacturers have developed unpackaged dice that are referred to in the industry as known good die (KGD). A known good die is an unpackaged die having the same quality and reliability as the equivalent packaged product. These unpackaged dice can be mounted directly to a printed circuit board or other supporting substrate to form multi chip modules and other hybrid electronic devices.

One advantage of an unpackaged die is that the size of the die is much smaller than the equivalent packaged die. In particular both the footprint (i.e., peripheral shape) and volume of an unpackaged die are less than a packaged die. This allows unpackaged dice to be mounted on a printed circuit board with an increased density.

A disadvantage of an unpackaged die is that forming an electrical connection with the die is more difficult because there are no external leads to the die. In some cases the die is placed directly on the circuit board and the bond pads on the die are wire bonded to corresponding connection points on the circuit board. As an alternative to wire bonding, some unpackaged dice are formed with bond pads having solder bumps. This type of die is sometimes referred to as "bumped die". A bumped die can be mounted face down on a printed circuit board, or other substrate, using a technique called "flip chip bonding". With flip chip bonding the bond pads on the die are aligned with connection points on the circuit board and the die is lowered face down into contact with the circuit board. The solder bumps on the die are then bonded to the connection points on the circuit board using heat, pressure or ultrasonic energy. Flip chip bonding is often accomplished using a special alignment and bonding fixture referred to as an aligner bonder. U.S. Pat. No. 4,899,921 to Bendat et al. discloses such an aligner bonder.

In addition to wire bonding and flip chip bonding, tape automated bonding (TAB) is sometimes used to form an electrical connection between the unpackaged die and external circuitry on a circuit board or other substrate. A TAB tape includes a flexible film such as polyimide having circuit traces formed thereon. The circuit traces can include bumps that are adapted for electrical connection to the bond pads on a die. The bumps and the circuit traces on the TAB tape provide an electrical path to external circuitry.

In general, an unpackaged die is more difficult to mount and electrically connect than a packaged die. In particular the packaged die is easier to handle and has external leads which can be soldered or mechanically connected to a standard electrical connection such as a socket. Additionally testing of unpackaged dice is more difficult for the same reasons. In order to certify an unpackaged die as a known good die a temporary electrical connection must be made to the bond pads of the die without damaging the die.

In view of the foregoing it would by advantageous to form a semiconductor die without a bulky package but with external leads to facilitate testing and electrical connection of the die.

Accordingly, it is an object of the present invention to provide an improved method for packaging semiconductor dice and an improved semiconductor package.

It is another object of the present invention to provide an improved semiconductor package having a thin, small outline but with external leads.

It is yet another object of the present invention to provide an improved method for packaging and then testing a die to provide a known good die.

It is still another object of the present invention to provide an improved method for packaging semiconductor dice that is simple, low cost and adaptable to large scale semiconductor manufacture.

Other objects, advantages and capabilities of the present invention will become more apparent as the description proceeds.

SUMMARY OF THE INVENTION

In accordance with the present invention, an improved method for packaging semiconductor dice and an improved semiconductor package are provided. The method, generally stated, includes the steps of: attaching a semiconductor die to a lead-on chip (LOC) leadframe; electrically connecting bond pads on the die to lead fingers on the leadframe; forming an encapsulating material on the bond pads and a portion of the lead fingers; forming a support structure on the leadframe; singulating the die from the leadframe with the support structure attached; testing the singulated die using the support structure; and then trimming the support structure and leadframe to form a package with external leads secured and protected by the encapsulating material.

The encapsulating material can be in the form of a glob top of a material such as silicone, epoxy, polyimide, acrylic or RTV compounds deposited on the die and lead fingers and then cured. In the completed package, the encapsulating material protects and seals the bond pads and bond wires. In addition, the encapsulating material secures the external leads to the die. Preferably the encapsulating material covers just the bond pads, bond wires and the terminal ends of the leads and leaves the remaining portions of the die exposed. This provides a small outline package having a foot print that is essentially the same as the unpackaged die.

The support structure attaches to the leadframe to provide a structure for supporting and handling each singulated die for testing while it is still attached to the leadframe. The support structure can be in the form of a molded carrier ring formed on the leadframe. Alternately the support structure can be in the form of an adhesive tape applied to the leadframe in a peripheral pattern to enclose the die. Using the support structure, the singulated dice can be subjected to full functionality and burn-in testing. The support structure is then removed from each die during the trim and form operation. Additionally, during the trim and form operation the leads are formed into a desired configuration such as J-lead, gull wing, flat, or butt joint. The completed semiconductor package can be attached to a supporting substrate, such as a printed circuit board, in the manner of a known good die.

BRIEF DESCRIPTION OF THE DRAWINGS

FIG. 3EE is a reduced in size plan view of FIG. 3E;

FIG. 3FF is a reduced in size plan view of FIG. 3F;

FIG. 3FA is a schematic view equivalent to FIG. 3F, showing an embodiment wherein the leads are formed in a J-bend configuration;

FIG. 3FB is a schematic view, equivalent to FIG. 3F, showing an embodiment wherein the leads are formed in a butt joint configuration;

FIG. 3FC is a schematic view, equivalent to FIG. 3F, showing an embodiment wherein the leads are formed in a gull wing configuration;

DETAILED DESCRIPTION OF THE PREFERRED EMBODIMENT

Figure 1:
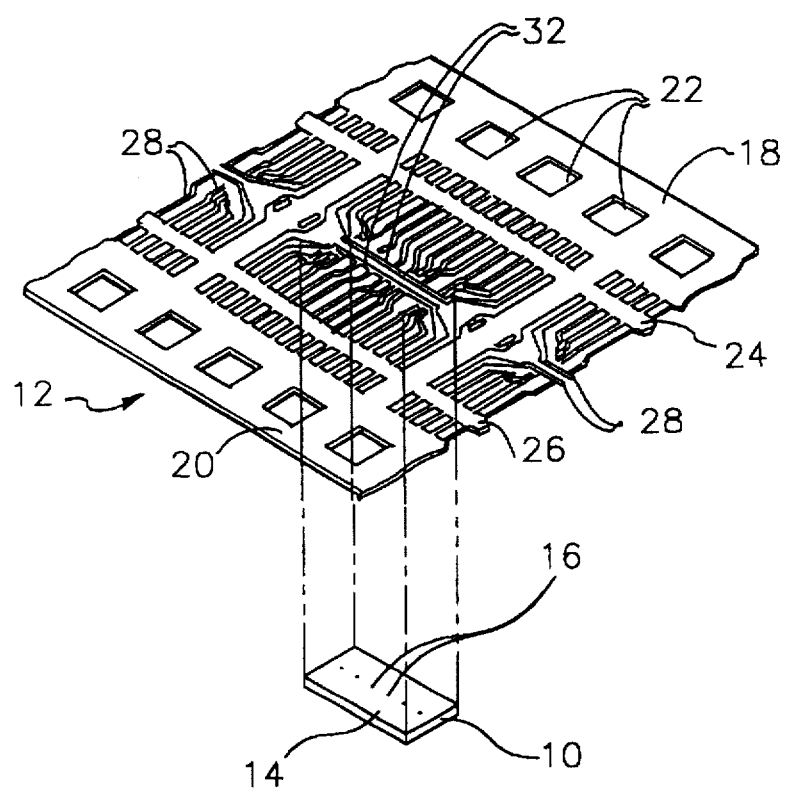
FIG. 1 is an exploded perspective view of a lead-on-chip leadframe and a semiconductor die which attaches to the leadframe.
Figure 2:
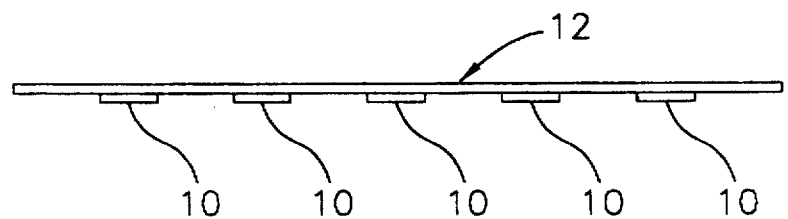
FIG. 2 is a side elevation view of the lead-on-chip leadframe showing a plurality of semiconductor dice attached to the leadframe.

Referring now to FIGS. 1 and 2, a lead-on-chip (LOC) die 10 and lead-on-chip (LOC) leadframe 12 are shown. The LOC die 10 is thin, flat and generally rectangular in shape and includes a die face 14, or active side, wherein the integrated circuitry is formed. A plurality of bond pads 16 are formed across the center portion of the die 10 in electrical contact with the integrated circuits formed on the die 10.

The leadframe 12 is formed from metal sheet and includes side rails 18, 20 formed with indexing holes 22. The indexing holes 22 facilitate transport and handling of the leadframe 12 by automated packaging machinery. The leadframe 12 also includes sidebars 24, 26 (or dam bars) for increased rigidity. The siderails 18, 20 and sidebars 24, 26 are trimmed away during a trim and form operation. In addition, the leadframe 12 includes a plurality of generally parallel and spaced lead fingers 28. During the packaging process the lead fingers 28 are bonded to thin bond wires 38 (FIG. 3D) which are also bonded to the bond pads 16 on the die 10. The lead fingers 28 will ultimately be trimmed and formed into leads 44 (FIG. 3F) which function to electrically connect the die 10 to the outside world. However, during the packaging process the lead fingers 28 function to support the die and facilitate heat transfer from the die 10 during the package process. The leadframe 12 can also include bus bars 32 for making multiple connections to the bond pads 16.

A preferred finish for the leadframe 12 is palladium plating. The leadframe 12 can also incorporate typical plating techniques (e.g., silver spot plating for wire bond areas, tin/lead plating for external leads). In addition the leadframe 12 can be formed with lead fingers 28 having a final lead shape (e.g., gull wing) or can be subjected to a subsequent forming step for the leads 44 (FIG. 3F). As shown in FIG. 2, several dice 10 are attached to the leadframe 12.

Figure 3A:
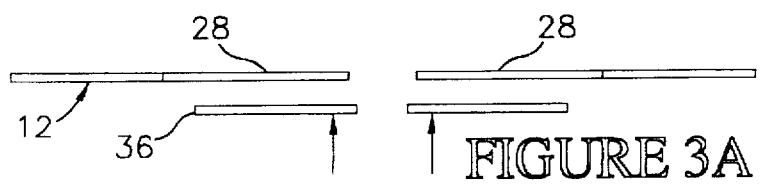
FIGS. 3A-3F are schematic side elevation views illustrating steps for packaging a semiconductor die in accordance with the invention.

With reference to FIG. 3A, a die 10 is attached to the leadframe 12 using an adhesive 36. The adhesive 36 can be in the form of a double sided adhesive tape cut or punched to size. This type of adhesive tape is also referred to as LOC tape and is commercially available from Hitachi Chemical Co., Ltd. and other suppliers. The adhesive 36 can also be in the form of a viscous material dispensed in a desired pattern using a screen or stencil. Suitable adhesives include epoxies, acrylics, polyimides and silicones. In addition, either thermoplastic or thermosetting adhesives can be employed. The adhesive 36 is patterned such that the bond pads 16 on the die 10 are left exposed for wire bonding.

Figure 3B:
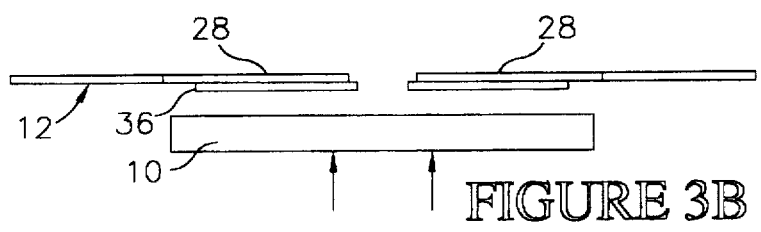

As shown in FIG. 3B, each die 10 is laminated to the leadframe 12 by pressing the die 10 against the leadframe 12 with the adhesive 36 sandwiched therebetween. Pressure can be applied by a suitable apparatus such as a movable arm pressing the assembly against a stationary platen. At the same time the adhesive 36 can be activated by heating the leadframe 12. This firmly attaches the die to the lead fingers 28 for the subsequent encapsulation process. One suitable die attach apparatus for performing the die lamination step is a ESEC 2005 LOC die attach system manufactured by ESEC SA, Cham, Switzerland.

Figure 3C:
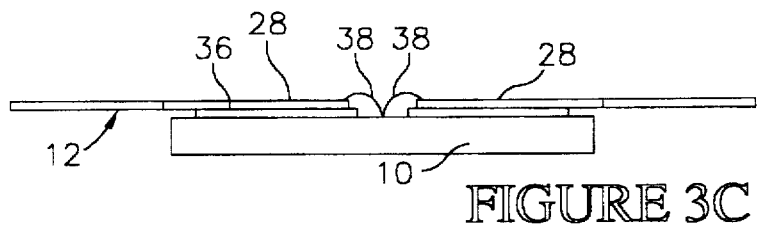

Next, as shown in FIG. 3C, the bond pads 16 (FIG. 1) on each die 10 are wire bonded to the lead fingers 28 on the leadframe 12 using thin bond wires 38. Wire bonding can be effected using a wire bonder apparatus and conventional semiconductor wire bonding techniques (e.g., gold ball thermosonic, aluminum wedge). One suitable wire bonding apparatus for performing the wire bonding step is manufactured by Kulicke and Soffa, Horsham, Pa. and is designated as a K&S Model 1484. Although wire bonding is the preferred method of forming an electrical connection between the bond pads 16 and lead fingers 28, a soldered connection can also be employed. In addition a mechanical electrical connection such as a sliding or piercing structure could also employed.

Figure 3D:
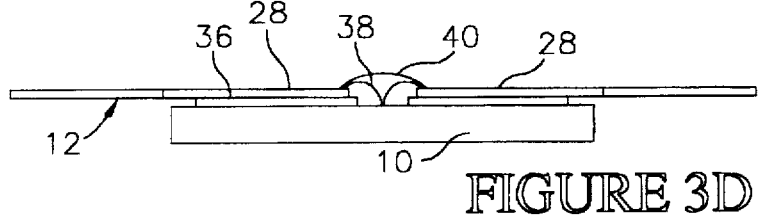

Next, as shown in FIG. 3D, an encapsulating material 40 is applied to the face of the die 10 and lead fingers 28. However, the encapuslating material 40 only covers a portion of the face of the die 10 and a tip portion of the lead fingers 28. Stated differently the encapuslating material covers only the wire bonding area on the die 10 and lead frame 12. The encapsulating material 40 is preferably in the form of a glob top that covers the bond pads 16, bond wires 38 and terminal portions of the lead fingers 28. As clearly shown in FIG. 3FF, the encapsulating material 40 leaves a large portion of the face of the die 10 exposed. A footprint (e.g., peripheral outline) of the completed package 46 (FIG. 3F) is thus about the same size as the peripheral dimensions of the die 10. In the completed package 46 (FIG. 3F), the encapsulating material 40 protects and seals the bond wires 38 and the points of attachment on the bond pads 16 (FIG. 1) and on the leads 44 (FIG. 3F). In addition, the encapsulating material 40 secures the leads 44 to the die 10.

The encapsulation material 40 can be formed as a glob top out of an epoxy, silicone, room temperature vulcanizing (RTV) or polyimide material. Suitable compounds are commercially available from Dexter/Hysol under the trademark of HYSOL 4450 and 4451 and from Thermoset under the trademark of EP-729.

For applying the encapsulation material 40 as a glob top there are two preferred methods. A first preferred method is to simply dispense the encapsulation material 40 directly over the wire bonded area of the die 10 and leadframe 12. A second preferred method is to dispense a continuous bead of one material with a higher viscosity around the perimeter of the wire bonded area as a dam and then fill the center area with a less viscous material. The encapsulation material 40 can be dispensed using suitable dispensing apparatus at a pressure of approximately 20 psi through a needle. Suitable dispensing apparatus are commercially available from Asymtek (A-400 & A-800) and MRSI (MRSI-170). Following application to the wire bonding area of the die 10 and leadframe 12, the encapsulation material can be cured at a temperature of about 165° C. for about 60 minutes.

Figure 3E:
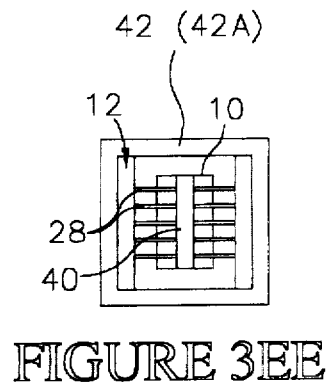
Figure 3E:
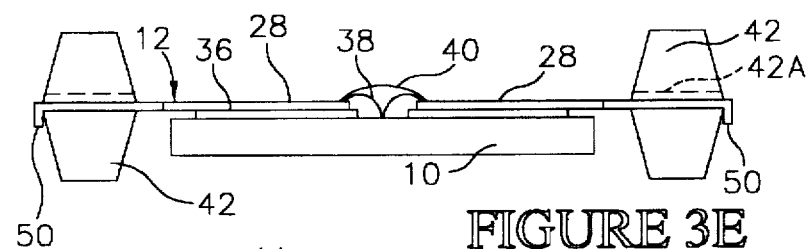
Figure 3F:
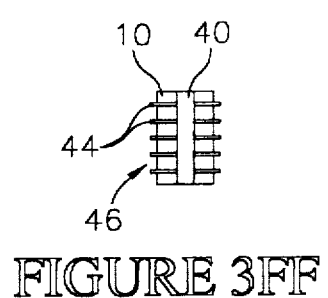
Figure 3F:
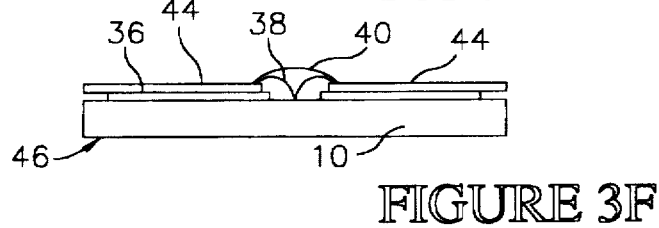
Figure 3F:
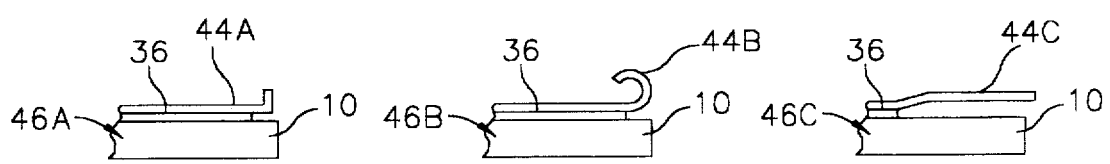

Following the dispensing and curing of the encapsulating material 40 and as shown in FIG. 3E, a support structure in the form of a molded carrier ring 42 is formed on the leadframe 12. The purpose of the molded carrier ring 42 is to facilitate handling and testing of the die 10. U.S. Pat. No. 4,837,184 to Lin et al., incorporated herein by reference, discloses a suitable process for forming the molded carrier ring 42. Briefly, the molded carrier ring 42 is formed by transfer molding a silica filled epoxy novolac around an outer portion of the leadframe 12.

Following the molding process, a singulating process, such as shearing or cutting, can be used to singulate each die 10 from the leadframe 12 with a corresponding portion of a molded carrier ring 42 formed thereon. As shown in FIG. 3EE, the molded carrier ring 42 on a singulated die 10 has a generally rectangular peripheral configuration. The molded carrier ring 42 provides a support structure for handling the singulated die 10 for testing. As an example, the molded carrier ring 42 can be attached to a test socket (not shown) and the die 10 tested using the exposed distal end 50 (FIG. 3E) of the lead fingers 28. By way of example U.S. Pat. No. 5,408,190 to Wood et al., incorporated herein by reference, discloses such a test socket.

Alternately the support structure can be in the form of support tape 42A applied to the leadframe 12 in a pattern to surround the die 10. This can be a square or rectangular pattern equivalent to the peripheral shape of the molded carrier ring 42 previously described. The support tape 42A can include either a thermosetting or thermoplastic adhesive formed on one side of a flexible substrate having a thickness of from 0.002" to 0.003". Such a tape can be a commercial tape similar to tape that is preapplied to leadframes by suppliers such as Sumitomo Metal & Mining. This type of tape is also commercially available from Hitachi Chemical Co., Ltd. and other suppliers.

Next, as shown in FIG. 3F, the leadframe 12 is trimmed such that the molded carrier ring 42 (or support tape 42A) is removed. The leadframe 12 can be trimmed using a suitable shearing or cutting apparatus. The leads 44 are then formed using a forming apparatus. In FIG. 3F, the leads 44 are in the form of flat leads. In FIG. 3FA, the leads 44A are formed in a butt joint configuration. In FIG. 3FB, the leads 44B are formed in a J-bend configuration. In FIG. 3FC, the leads 44C are formed in a gull wing configuration. For the gull wing configuration, the lead fingers 28C of the leadframe 12 are preferably pre-bent in a gull wing shape during formation of the leadframe 12.

Figure 4A:
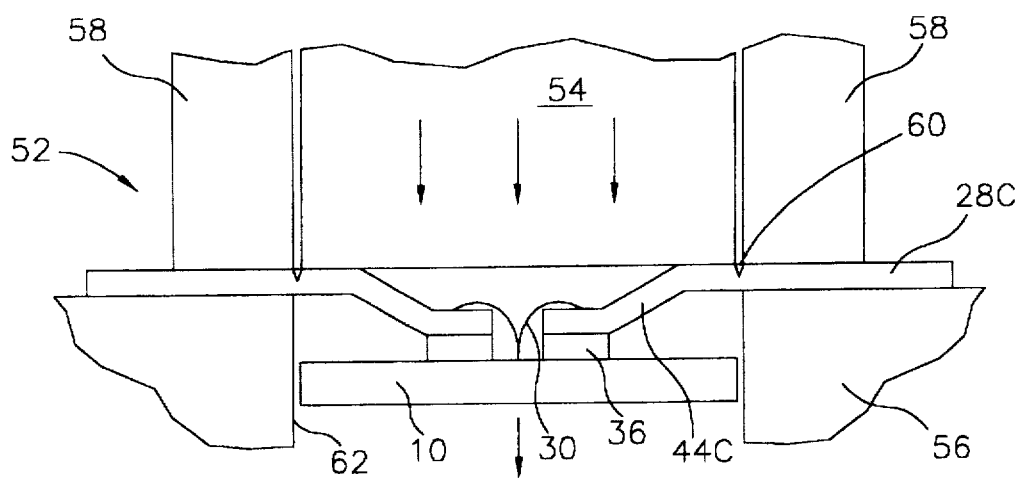
FIG. 4A is a schematic view illustrating an apparatus for trimming and forming the leads for the package in a gull wing configuration.

FIG. 4A illustrates a forming apparatus 52 for forming the leads 44C in a gull wing configuration. The same apparatus 52 could be used to form leads 44 (FIG. 3F) in a flat configuration. The forming apparatus 52 includes a singulation punch 54; a trim die 56 and a stripper pad 58. Preferably the lead fingers 28C are pre-notched with a notch 60. The notch 60 prevents the formation of burrs in the completed lead 44C. The singulation punch 54 is mounted for reciprocal movement and is adapted to punch the die 10 into an opening 62 formed in the trim die 56. The forming apparatus 52 is adapted to trim and form the lead fingers 28C such that the completed leads 44C project past the edges of the die 10 by only a small amount (e.g., about 0.003 to 0.005 inches). This helps to provide a completed package 46 (FIG. 3F) with a small footprint.

Figure 4B:
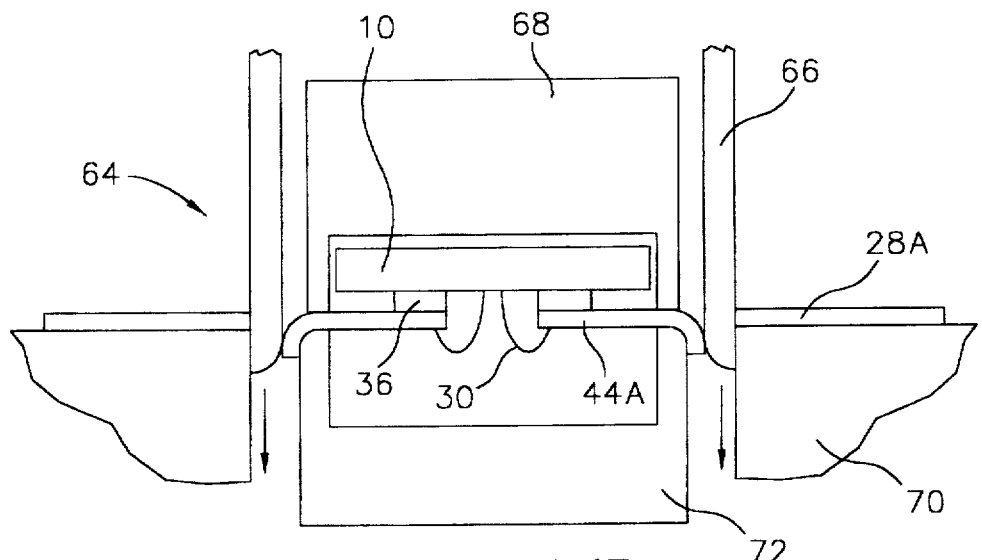
FIG. 4B is a schematic view illustrating apparatus for trimming and forming the leads for the package in a butt joint configuration.

FIG. 4B illustrates a forming apparatus 64 adapted to form leads 44A in a butt joint configuration. The forming apparatus 64 includes a pressure pad 68 for holding the die 10; a lead shear die 70 for holding the leadframe 28A; a reciprocal punch 66 for shearing the leadframe 28A; and a form anvil 72 for shaping the leads 44A. Using such a forming apparatus 64 the leads 44A protrude from the edges of the die 10 by a distance approximately equal to the thickness of the leads 44A (e.g., about 0.010 inches).

Figure 5:
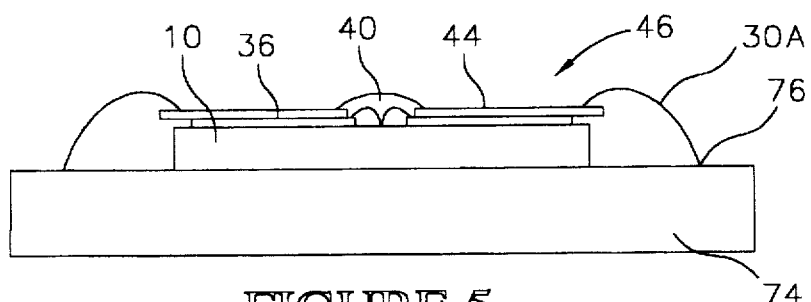
FIG. 5 is a schematic view of a package formed in accordance with the invention and attached to a supporting substrate.

FIG. 5 illustrates a chip on board application for a package 46 formed in accordance with the invention. Such an application can be used to form a multi chip module and other hybrid electronic devices that typically employ unpackaged semiconductor die. In this chip-on-board application, the package 46 is mounted on a supporting substrate 74 such as a printed circuit board. An electrical connection is established between the leads 44 on the package 46 and corresponding connection points 76 on the substrate 74 using bond wires 30A. The bond wires 30A also secure the package 46 to the substrate 74. An adhesive can also be employed to secure the package 46 to the substrate 74.

Thus the invention provides an improved method for packaging a semiconductor die and an improved semiconductor package 46. The package 46 has a footprint (outline) that is approximately equal to the peripheral shape of an unpackaged semiconductor die 10. In addition, the package 46 can be tested and certified as a known good die (KGD) using a suitable test fixture. Furthermore the package 46 includes external leads 44 for establishing an electrical connection to the integrated circuits on the die 10. Such a package 46 can be used for chip-on-board applications and to form multi chip modules and other electronic devices.

While the invention has been described with reference to certain preferred embodiments, as will be apparent to those skilled in the art, certain changes and modifications can be made without departing from the scope of the invention as defined by the following claims.

What is claimed is:

1. A semiconductor package comprising:

a semiconductor die comprising a face having a peripheral outline and a bond pad on the face;

a lead comprising a lead finger of a leadframe, said lead separated from the leadframe and attached to the face of the die;

a wire bonded to the lead and to the bond pad; and an encapsulating material deposited on a portion of the face of the die to cover the bondpad, the wire, a portion of the lead, and an area on the face of the die less than the peripheral outline, while leaving a remainder of the die and the face exposed.

2. The package as claimed in claim 1 wherein the encapsulating material comprises a material selected from the group consisting of epoxy, silicone, room temperature vulcanizing materials and polyimide.

3. The package as claimed in claim 1 further comprising a support structure attached to the lead and configured to support the package for testing.

4. The package as claimed in claim 1 further comprising a molded carrier ring attached to the lead.

5. A semiconductor package comprising:

a semiconductor die comprising a face and a bond pad;

a lead comprising a separated lead finger of a lead-on-chip leadframe, said lead including a portion attached to the face of the die and a terminal portion electrically connected to the bond pad;

a support structure attached to the lead, said support structure comprising a molded carrier ring; and an encapsulating material deposited on the face of the die to encapsulate the bond pad and the terminal portion of the lead, while leaving a remaining portion of the die exposed.

6. The package as claimed in claim 5 further comprising a wire bonded to the terminal portion of the lead and bonded to the bond pad to electrically connect the lead to the bond pad, said wire covered by the encapsulating material.

7. The package as claimed in claim 5 wherein said support structure is configured to support the package for testing.

8. The package as claimed in claim 5 wherein the support structure is configured for handling the package for testing.

9. The package as claimed in claim 5 wherein the support structure comprises epoxy novoloc.

10. A semiconductor package comprising:

a semiconductor die comprising a face and a pattern of bond pads;

a plurality of leads comprising separated lead fingers of a lead-on-chip leadframe, said leads including terminal portions and portions attached to the face of the die with an adhesive layer;

a plurality of wires wire bonded to the bond pads and to the terminal portions of the leads;

an encapsulating material deposited on the face of the die to encapsulate the bond pads, the wires and the terminal portions of the leads; and a support structure attached to the leads.

11. The package as claimed in claim 10 wherein the support structure comprises a molded carrier ring.

12. The package as claimed in claim 10 wherein the support structure comprises adhesive tape applied to the leads.

13. The package as claimed in claim 10 wherein the encapsulating material comprises a first curable material formed as a dam and a second curable material deposited within the dam.

14. A semiconductor package comprising:

a semiconductor die having a peripheral outline, said die comprising a face with a pattern of pads formed thereon;

a plurality of leads attached to the die in electrical communication with the pads, each said lead comprising a separated lead finger from a lead-on-chip leadframe, each said lead comprising a first portion wire bonded to a pad on the die, a second portion attached to the face of the die with an adhesive, and a third portion formed in a desired configuration;

a plurality of bond wires wired bonded to the pads on the die and to the terminal portions of the leads; and a curable material deposited on the face of the die to cover the bondwires, the pads on the die, the terminal portions of the leads, and an area on the face of the die less than the peripheral outline.

15. The package as claimed in claim 14 wherein the desired configuration of the third portions of the leads comprises a package configuration selected from the group consisting of gull wing, J-bend, butt joint and flat.

16. The package as claimed in claim 14 further comprising a molded carrier ring attached to the leads.

17. The package as claimed in claim 14 further comprising adhesive tape attached to the leads.

18. The package as claimed in claim 14 wherein the curable material comprises a first curable material formed as a dam and a second curable material deposited within the dam.

19. The package as claimed in claim 14 further comprising a substrate attached to the die, said substrate including connection points wire bonded to the leads.

20. An electrical assembly comprising:

a supporting substrate including a plurality of connection points;

a semiconductor package mounted to the supporting substrate in a chip on board configuration;

said package including a semiconductor die comprising a face and a bond pad;

said package further including a lead comprising a separated lead finger of a lead-on-chip leadframe, said lead including a portion attached to the face of the die and a terminal portion electrically connected to the bond pad;

said package further including an encapsulating material deposited on the face of the die to encapsulate the bond pad and the terminal portion of the lead, while leaving a remaining portion of the die exposed; and a plurality of bond wires bonded to the connection points on the substrate and the leads on the package.

21. The assembly as claimed in claim 20 wherein the supporting substrate comprises a printed circuit board.

22. The assembly as claimed in claim 20 wherein a plurality of packages are mounted to the supporting substrate to form a multi chip module.

* * * * *